United States Patent
Yeh et al.

(10) Patent No.: US 8,993,393 B2
(45) Date of Patent: Mar. 31, 2015

(54) MULTIPLE SILICIDE INTEGRATION STRUCTURE AND METHOD

(75) Inventors: Der-Chyang Yeh, Hsin-Chu (TW); Hsing-Kuo Hsia, Jhubei (TW); Hao-Hsun Lin, Taipei (TW); Chih-Ping Chao, Hsin-Chu (TW); Chin-Hao Su, Hsin-Chu (TW); Hsi-Kuei Cheng, Jhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 512 days.

(21) Appl. No.: 12/704,296

(22) Filed: Feb. 11, 2010

(65) Prior Publication Data

US 2011/0193174 A1 Aug. 11, 2011

(51) Int. Cl.
*H01L 29/72* (2006.01)
*H01L 21/8249* (2006.01)
*H01L 21/285* (2006.01)
*H01L 27/06* (2006.01)

(52) U.S. Cl.
CPC ...... *H01L 21/8249* (2013.01); *H01L 21/28518* (2013.01); *H01L 27/0623* (2013.01)
USPC ............ 438/202; 257/370; 257/E21.696; 257/E27.015

(58) Field of Classification Search
USPC ............ 438/202; 257/370, E21.696, E27.015
See application file for complete search history.

(56) References Cited

U.S. PATENT DOCUMENTS

| | | | |
|---|---|---|---|
| 2001/0023978 A1* | 9/2001 | Igarashi et al. | 257/565 |
| 2006/0019437 A1* | 1/2006 | Murto et al. | 438/199 |
| 2007/0122966 A1* | 5/2007 | Hoentschel et al. | 438/231 |
| 2010/0084713 A1* | 4/2010 | Nakagawa et al. | 257/369 |
| 2010/0181624 A1* | 7/2010 | Takahashi | 257/369 |

* cited by examiner

*Primary Examiner* — Edward Wojciechowicz
(74) *Attorney, Agent, or Firm* — Slater & Matsil, L.L.P.

(57) ABSTRACT

A structure and method for providing a multiple silicide integration is provided. An embodiment comprises forming a first transistor and a second transistor on a substrate. The first transistor is masked and a first silicide region is formed on the second transistor. The second transistor is then masked and a second silicide region is formed on the first transistor, thereby allowing for device specific silicide regions to be formed on the separate devices.

20 Claims, 7 Drawing Sheets

US 8,993,393 B2

MULTIPLE SILICIDE INTEGRATION STRUCTURE AND METHOD

TECHNICAL FIELD

Present embodiments relate generally to a system and method for forming semiconductor devices and, more particularly, to a system and method for forming integrated silicide regions on integrated devices.

BACKGROUND

Silicide regions have historically been used to help form contacts in the connection of semiconductor devices to metallization layers in an integrated circuit. These silicide regions are generally formed by annealing a metal in contact with silicon to help reduce the contact resistance for the various devices formed as part of integrated circuits, such as CMOS transistors. In more advanced integrated circuits, other types of devices, such as bipolar devices may be integrated with the CMOS technology to form derivative technologies, such as BiCMOS or embedded flash technologies. In wafers that contain both CMOS and, e.g., bipolar devices, a single silicide process has generally been used to form silicide regions on each of the separate devices (e.g., a CMOS transistor, a bipolar transistor, etc.), forming silicide regions for all of the devices at the same time and utilizing a single process.

However, this single contact approach is undesirable for derivative technologies that comprise both CMOS devices and other types of devices. First, the derivative technologies generally generate a step height between, e.g., the CMOS transistor and a bipolar transistor, which could be as large as 3,000 Å. Further, these different devices may have differently sized contact widths, or even necessitate the formation of a silicide on a non-planar surface. These differences could lead to difficulties in integrating the different processes used to manufacture the different devices, and could even cause processing difficulties, such as over-etching, that would directly impact the functionality and, thereby, the yield, of the semiconductor devices. In addition, non-CMOS derivative devices may have different silicide sheet resistance requirements from standard CMOS.

SUMMARY

These and other problems are generally solved or circumvented, and technical advantages are generally achieved, by embodiments which illustrate an integrated silicide structure and method.

In accordance with an embodiment, a method for manufacturing a semiconductor device comprises providing a substrate with a first region and a second region, forming a first type of transistor in the first region and forming a second type of transistor in the second region. A first protective layer is formed over the first type of transistor such that the second type of transistor is exposed and a first silicide is formed on the second type of transistor. The first protective layer is removed from the first type of transistor and a second protective layer is formed over the second type of transistor such that the first type of transistor is exposed. A second silicide is formed on the first type of transistor, the second silicide having at least one characteristic that is different than the first silicide.

In accordance with another embodiment, a method of manufacturing a semiconductor device comprises providing a substrate with a first region and a second region and forming a first transistor in the first region and a second transistor in the second region, wherein the first transistor is a first type of transistor and the second transistor is a second type of transistor. The first transistor is masked with a first protective layer while exposing the second transistor and a first silicide is formed on the second transistor, the first silicide comprising a first material. The second transistor is masked with a second protective layer while exposing the first transistor and a second silicide is formed on the first transistor, the second silicide comprising a second material different from the first material.

In accordance with yet another embodiment, semiconductor device comprises a substrate with a first transistor and a second transistor, the second transistor being a different type of transistor than the first transistor. A first silicide region is located on the first transistor, the first silicide region comprising a first material and having a first thickness. A second silicide region is located on the second transistor, the second silicide region comprising a second material different from the first material and having a second thickness different from the first thickness.

BRIEF DESCRIPTION OF THE DRAWINGS

For a more complete understanding of embodiments, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of the embodiments are discussed in detail below. It should be appreciated, however, that the embodiments provide many applicable inventive concepts that can be embodied in a wide variety of specific contexts. The specific embodiments discussed are merely illustrative of specific ways to make and use the embodiments, and do not limit the scope of the embodiments.

Embodiments will be described in a specific context, namely a semiconductor device comprising both a CMOS device and a bipolar device in BiCMOS technology. These embodiments may also be applied, however, to other devices which used integrated devices.

Figure 1:
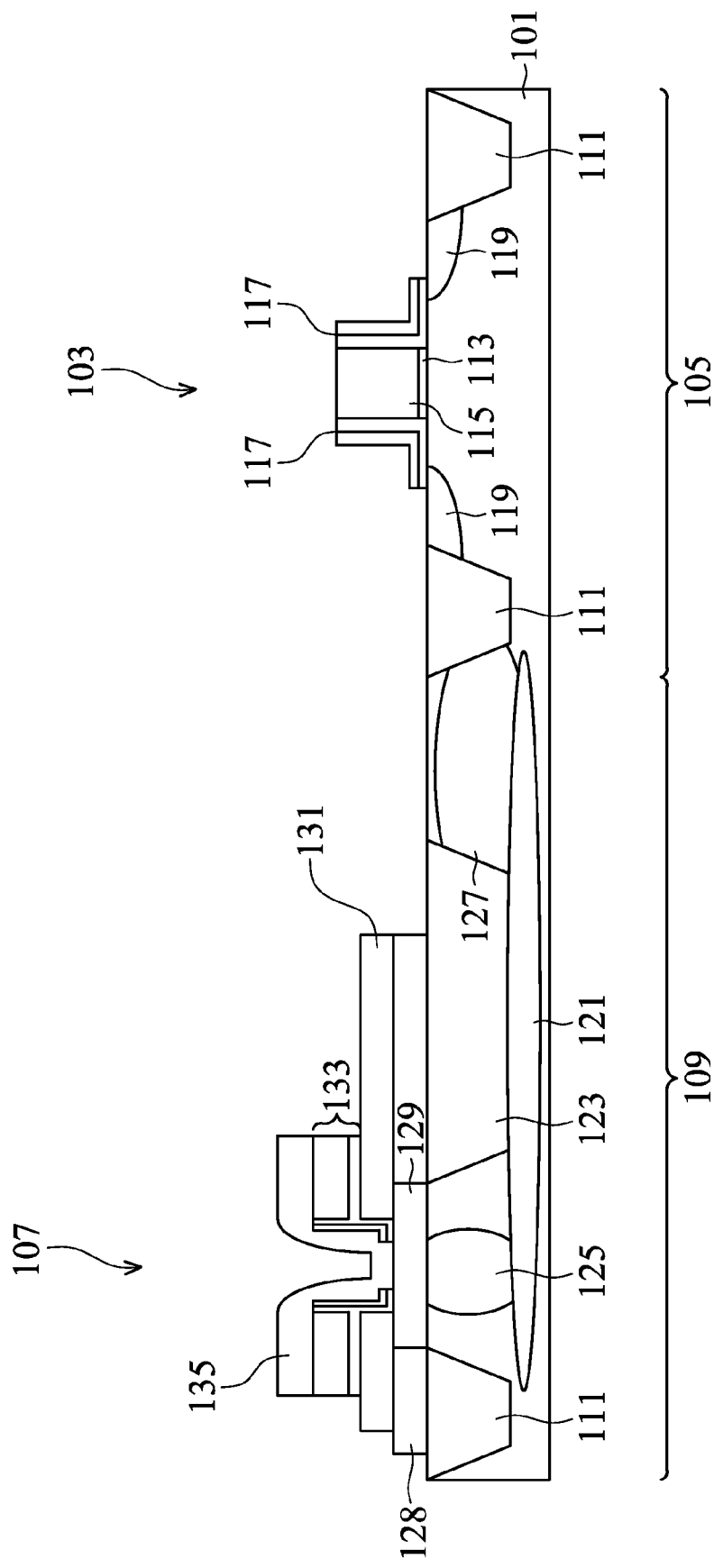
FIG. 1 illustrates a first transistor and a second transistor in accordance with an embodiment.

With reference now to FIG. 1, there is shown a substrate 101 with a first transistor 103 in a first region 105 and a second transistor 107 in a second region 109. The substrate 101 may comprise a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the substrate 101 may comprise a silicon-on-insulator (SOI) substrate. Generally, an SOI substrate comprises a layer of a semiconductor material such as epitaxial silicon, germanium, silicon germanium, SOI, silicon germanium on insulator (SGOI), or combinations thereof. The substrate 101 may be doped with a p-type dopant, such as boron, aluminum, gallium, or the like, although the substrate 101 may alternatively be doped with an n-type dopant, as is known in the art.

The substrate 101 additionally comprises a plurality of isolation structures 111 designed to separate and isolate various devices formed on the substrate 101, and also to separate the first region 105 from the second region 109. The isolation structures 111 may be shallow trench isolations generally formed by etching the substrate 101 to form a trench and filling the trench with dielectric material as is known in the art. The isolation structures 111 may be filled with a dielectric material such as an oxide material, a high-density plasma (HDP) oxide, or the like, formed by any suitable process known in the art. Optionally, an oxide liner (not shown) may be formed along the sidewalls isolation structures 111.

The first transistor 103 may be a CMOS transistor and may comprise a gate dielectric 113 adjacent the substrate 101, a gate electrode 115 over the gate dielectric 113, and spacers 117 along the sidewalls of the gate dielectric 113 and gate electrode 115. Gate dielectric 113 and gate electrode 115 may be formed and patterned on the substrate 101 by any suitable process known in the art. The gate dielectric 113 may be a high-K dielectric material, such as silicon oxide, silicon oxynitride, silicon nitride, an oxide, a nitrogen-containing oxide, aluminum oxide, lanthanum oxide, hafnium oxide, zirconium oxide, hafnium oxynitride, a combination thereof, or the like. The gate dielectric 113 may have a relative permittivity value greater than about 4.

In an embodiment in which the gate dielectric 113 comprises an oxide layer, the gate dielectric 113 may be formed by any oxidation process, such as wet or dry thermal oxidation in an ambient comprising an oxide, $H_2O$, NO, or a combination thereof, or by chemical vapor deposition (CVD) techniques using tetra-ethyl-ortho-silicate (TEOS) and oxygen as a precursor.

In one embodiment, the gate dielectric 113 is between about 10 Å to about 150 Å in thickness, such as 100 Å in thickness.

The gate electrode 115 may comprise a conductive material, such as a metal (e.g., tantalum, titanium, molybdenum, tungsten, platinum, aluminum, hafnium, ruthenium), a metal nitride (e.g., titanium nitride, tantalum nitride), doped poly-crystalline silicon, other conductive materials, or a combination thereof. In one example, amorphous silicon is deposited and recrystallized to create poly-crystalline silicon (poly-silicon). In an embodiment in which the gate electrode 115 is poly-silicon, the gate electrode 115 may be formed by depositing doped or undoped poly-silicon by low-pressure chemical vapor deposition (LPCVD) to a thickness in the range of about 100 Å to about 2,500 Å, such as about 1,200 Å.

Spacers 117 are formed on the sidewalls of the gate dielectric 113 and the gate electrode 115. The spacers 117 may be one or more layers of dielectric material (two layers are illustrated in FIG. 1) and may be formed by blanket depositing one or more spacer layers (not shown) on the previously formed structure. The spacer layers may comprise SiN, oxynitride, SiC, SiON, oxide, and the like, and may be formed by commonly used methods such as chemical vapor deposition (CVD), plasma enhanced CVD, sputter, and other methods known in the art. The spacer layers are then patterned to form the spacers 117, such as by a series of anisotropic and isotropic etchings to shape the spacer layer into the spacers 117.

Source/drain regions 119 may be formed in the substrate 101 on opposing sides of the gate dielectric 113. In an embodiment in which the substrate 101 is a p-type substrate, the source/drain regions 119 may be formed by implanting appropriate n-type dopants such as phosphorous, arsenic, antimony, or the like. The source/drain regions 119 may be implanted using the gate electrode 113 and the spacers 117 as masks to form the source/drain regions 119.

It should be noted that one of ordinary skill in the art will realize that many other processes, steps, or the like may be used to form the source/drain region 119. For example, one of ordinary skill in the art will realize that a plurality of implants may be performed using various combinations of spacers and liners to form the source/drain regions 119 having a specific shape or characteristic suitable for a particular purpose. Any of these processes may be used to form the source/drain regions 119, and the above description is not meant to limit the present embodiments to the steps presented above.

The second transistor 107 may be another type of transistor instead of a CMOS transistor. For example, the second transistor 107 may be a bipolar transistor. However, while FIG. 1 illustrates an embodiment that illustrates a bipolar transistor, this illustrative embodiment is not meant to be limiting in any respect. Other suitable devices, such as junction gate field-effect transistors (JFETs), insulated gate bipolar transistors (IGBTs), floating gate transistors, high voltage transistors or the like, may alternatively be utilized while still remaining within the scope of the embodiments presented herein.

In an embodiment in which the second transistor 107 is a bipolar transistor, the second transistor 107 may include an N+ buried layer 121, a second isolation structure 123, a collector 125, a collector sinker 127, a base 129, a base connection 131, second spacers 133 and emitter 135. The individual elements of the second transistor 107 may be formed from any suitable manufacturing processes and, as such, are not repeated here for the sake of clarity.

Figure 2:
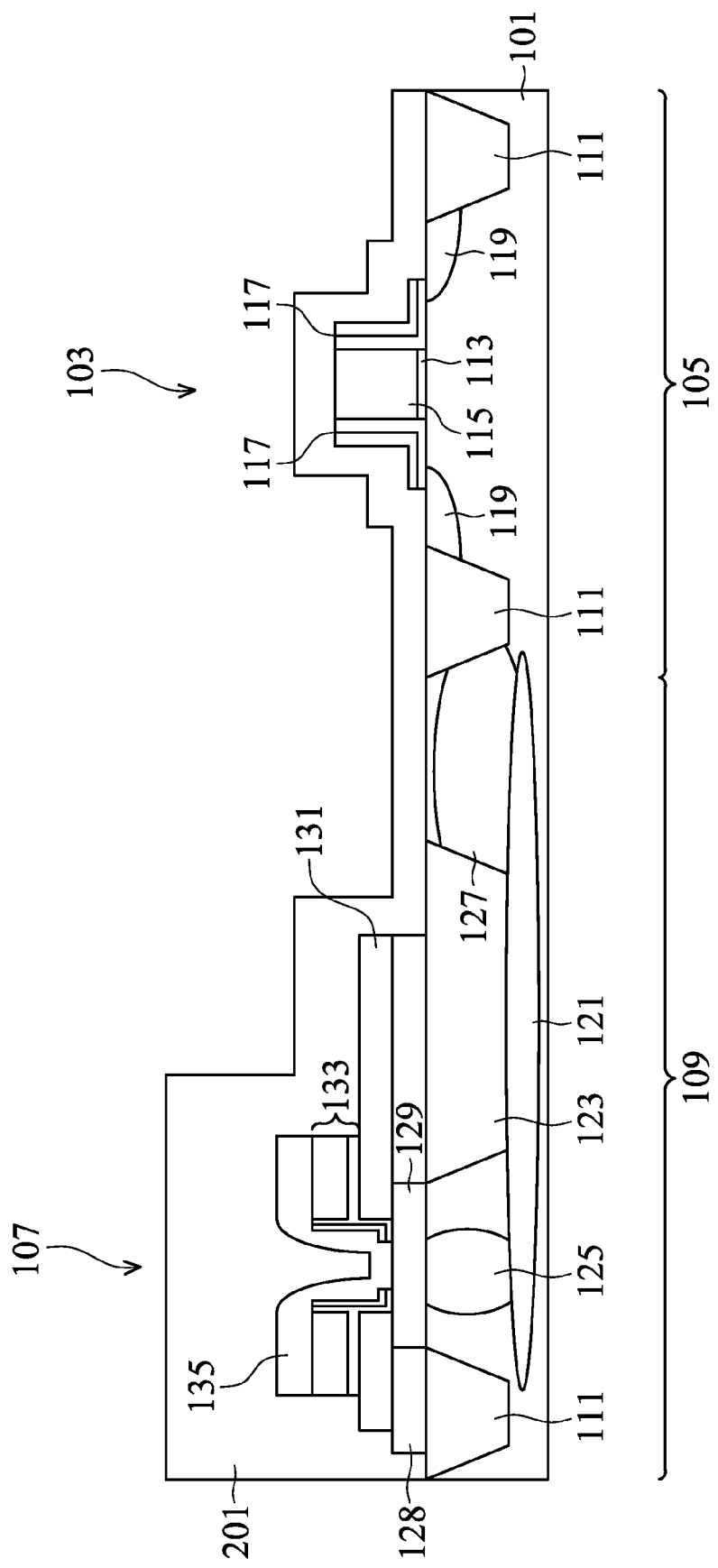
FIG. 2 illustrates the formation of a first resist protective oxide over the first transistor and second transistor in accordance with an embodiment.

FIG. 2 illustrates the formation of a first protective layer 201 over the first transistor 103 in the first region 105 and the second transistor 107 in the second region 109. The first protective layer 201 may be a resist protective oxide (RPO) and may comprise an oxide such as silicon oxide, although other suitable materials, such as silicon oxynitride, silicon nitride, combinations of these, and the like, may alternatively be used. The first protective layer 201 may be formed using a process such as low pressure chemical vapor deposition (LPCVD) or plasma enhanced chemical vapor deposition (PECVD), although any suitable process may be utilized. The first protective layer 201 may be formed to a thickness of between about 50 Å and about 800 Å.

By using a relatively lower grade oxide for the first protective layer 201 instead of a relatively higher grade dual contact mask, the financial impacts of this extra intermediate masking step may be reduced, thereby obtaining the benefits of the extra masking step without necessarily obtaining the additional costs that would normally be associated with a high-grade contact mask. Such a step helps to increase integration at a lower costs than would otherwise be obtainable with a standard dual contact hardmask process.

Optionally, once the first protective layer 201 has been formed, a first rapid thermal anneal (RTA) may be performed.

The first RTA may be used to activate the source/drain regions 119 of the first transistor 103, and may be performed at a temperature of about 950° C. to 1200° C., such as about 1010° C., for about 15 to 30 seconds, such as about 20 seconds.

Figure 3:
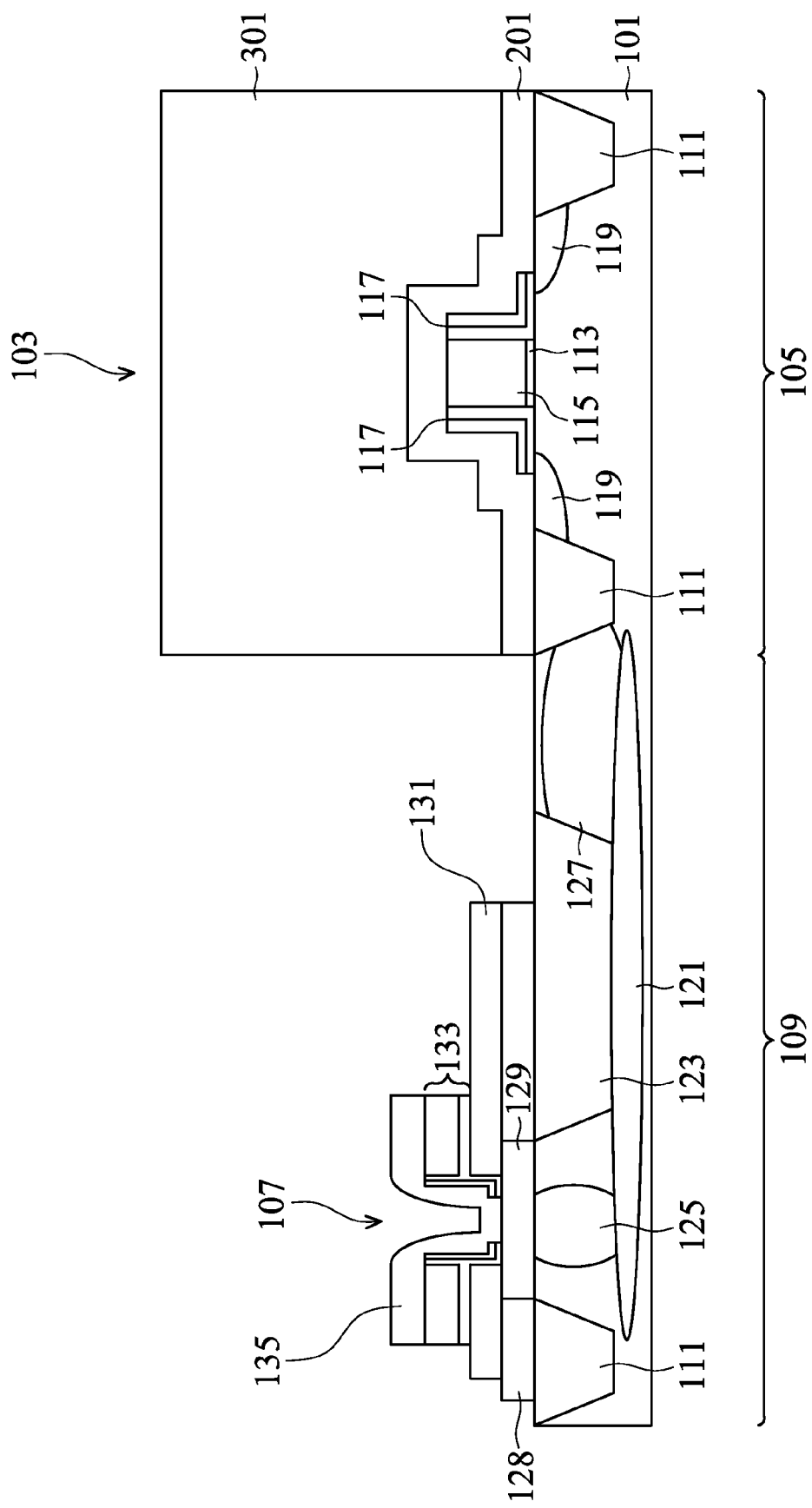
FIG. 3 illustrates the patterning of the first resist protective oxide in accordance with an embodiment.

FIG. 3 illustrates a patterning of the first protective layer 201 once the first protective layer 201 has been formed over the first region 105 and the second region 109. The first protective layer 201 may be patterned to expose the second transistor 107 in the second region 109 without exposing the first transistor 103 in the first region 105. The patterning may be performed using a suitable photolithographic technique, such as the formation of a patterned first photoresist 301 followed by a suitable etching of the first protective layer 201. In an embodiment, the etching may be performed as a wet etch utilizing an etchant such as HF However, any other suitable technique to expose the first transistor 107 without exposing the second transistor 103, such as a dry etch, may alternatively be utilized.

Figure 4:
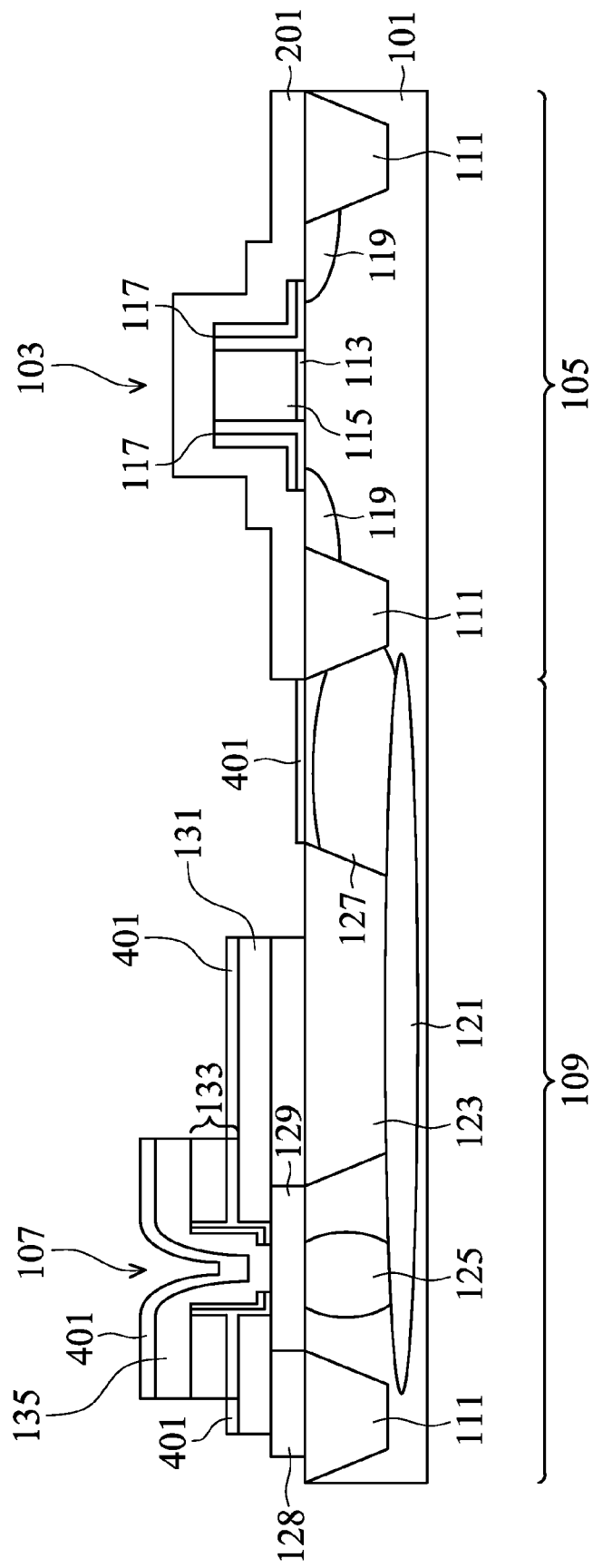
FIG. 4 illustrates the formation of a first silicide in accordance with an embodiment.

FIG. 4 illustrates the removal of the first photoresist 301 and the formation of first silicide contacts 401. In an embodiment, the first photoresist 301 may be removed using a suitable removal process such as ashing that is known in the art. This removal exposes the first protective layer 201 without exposing the first transistor 103 protected by the first protective layer 201.

After the first photoresist 301 has been removed, an optional cleaning step may be performed. In an embodiment the cleaning step may include dipping the second transistor 107 into an etchant in order to ensure that any remaining portions of the first protective layer 201 (or any other oxides that may have formed on the second transistor 107) are removed from the second transistor prior to the formation of the first silicide contacts 401. For example, the second transistor 201 may be dipped into an etchant such as HF for between about 10 seconds and about 30 seconds, such as about 20 seconds.

However, the removal of any remaining oxides from the second transistor 107 also has the potential to remove portions of the first protective layer 201 and potentially expose undesired portions of the first transistor 103. As such, in an embodiment, the first protective layer 201 located over the first transistor 103 may be monitored during and/or after the cleaning process to ensure that the first transistor 103 remains protected by the first protective layer 201 and that no part of the first transistor 103 is exposed by the cleaning process. For example, the first protective layer 201 may be monitored using a process such as on-wafer ellipsometer in order to ensure the protection of the first transistor 103, although any suitable method of monitoring may alternatively be used.

Once the cleaning process has been completed, first silicide contacts 401 may be formed on the emitter 135 of the second transistor 107 and along the exposed substrate 101 over the collector sinker 127, but not along the first region 105 of the substrate 101 protected by the first protective layer 201. The first silicide contacts 401 may be formed from a portion of the surface of the substrate 101 and the base connection 131. The first silicide contacts 401 may comprise cobalt, such as, for example, cobalt silicide. However, other commonly used metals, such as titanium, nickel, palladium, platinum, erbium, combinations of these, and the like, may also be used. The silicidation may be performed by a blanket deposition of one or more appropriate metal layers, followed by an annealing step, such as a second RTA, in which the metal or metals react with the underlying exposed silicon. Unreacted metal may then be removed, for example, with a selective etch process. The thickness of the first silicide contacts 401 may be between about 3 nm and about 50 nm, such as about 15 nm.

Figure 5:
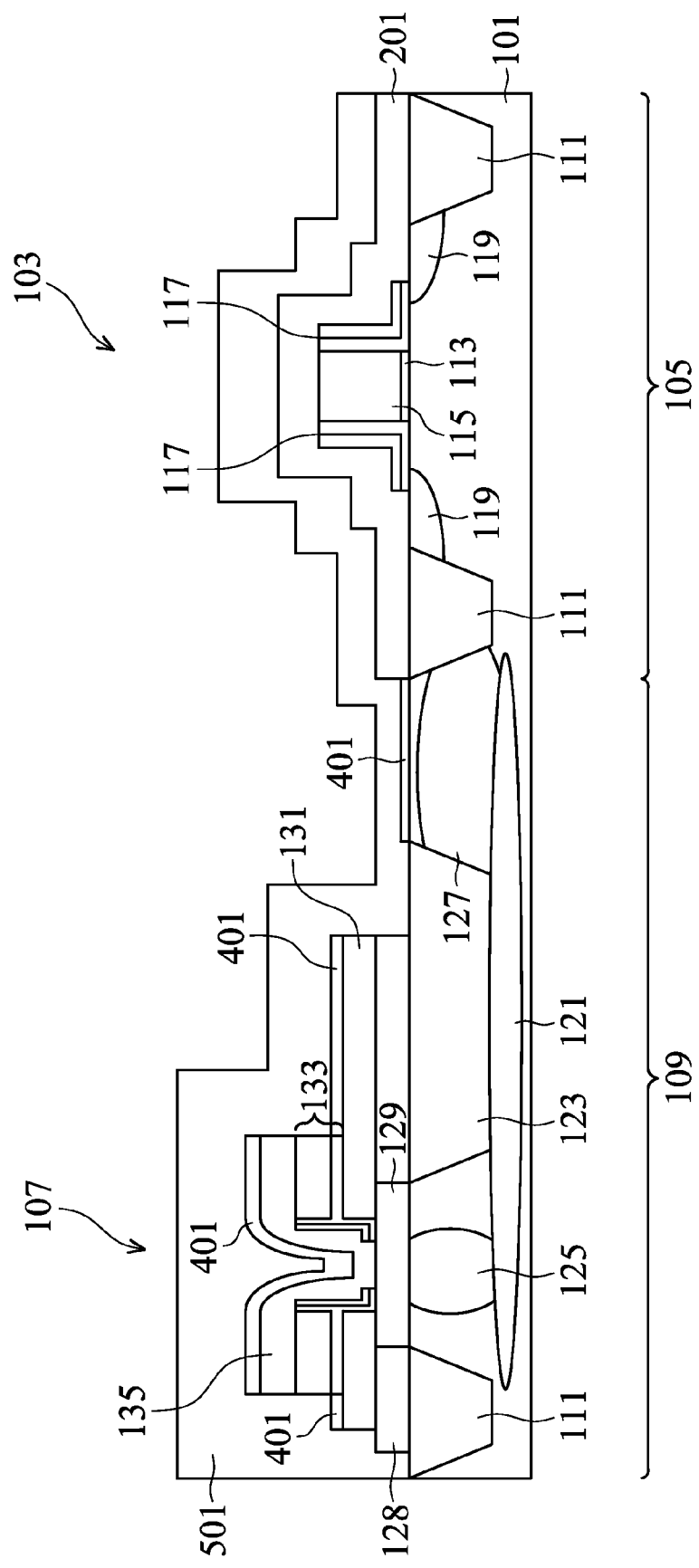
FIG. 5 illustrates the formation of a second resist protective oxide in accordance with an embodiment.

FIG. 5 illustrates the formation of a second protective layer 501 over the first protective layer 201 and also over the second transistor 107 in the second region 109 of the substrate 101. The second protective layer 501 may be formed of, for example, a standard RPO mask such as silicon nitride or oxynitride, although any other suitable protective layer may alternatively be utilized. Additionally, the second protective layer 501 may be formed using, for example, a process such as low pressure chemical vapor deposition (LPCVD) or plasma enhanced chemical vapor deposition (PECVD), although any other suitable process may alternatively be utilized. The second protective layer 501 may be formed to a thickness of between about 50 Å and about 800 Å.

Figure 6:
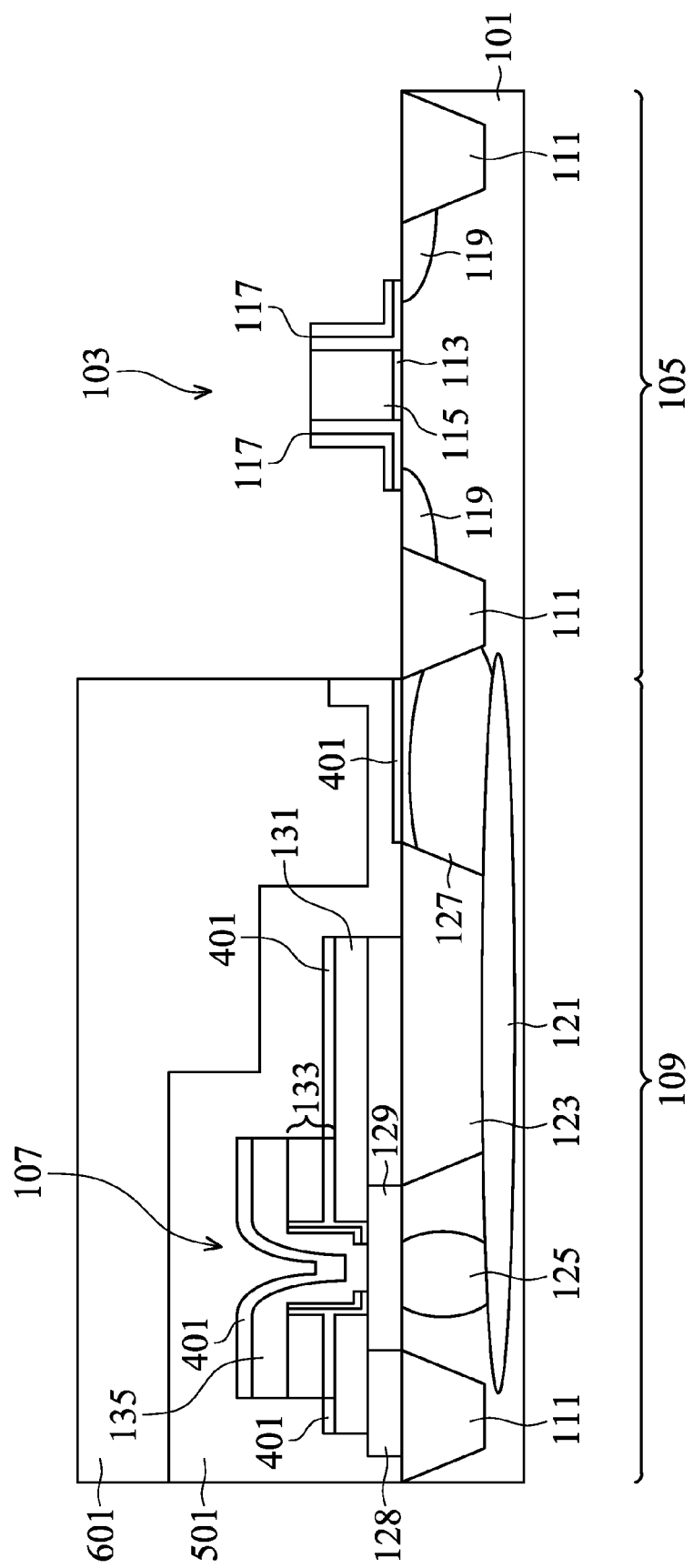
FIG. 6 illustrates the patterning of the second resist protective oxide in accordance with an embodiment.

FIG. 6 illustrates a patterning of the second protective layer 501 and the removal of the second protective layer 501 and the first protective layer 201 from the first transistor 103 and the first region 105 of the substrate 101. The second protective layer 501 may be patterned to expose the first transistor 103 in the first region 105 without exposing the second transistor 107 in the second region 109. The patterning may be performed using a suitable photolithographic technique, such as the formation of a patterned second photoresist 601 followed by a suitable etching of the second protective layer 501 using a suitable etchant such as a dry etch or wet HF. However, any other suitable technique to expose the first transistor 103 without exposing the second transistor 107 may alternatively be utilized.

Figure 7:
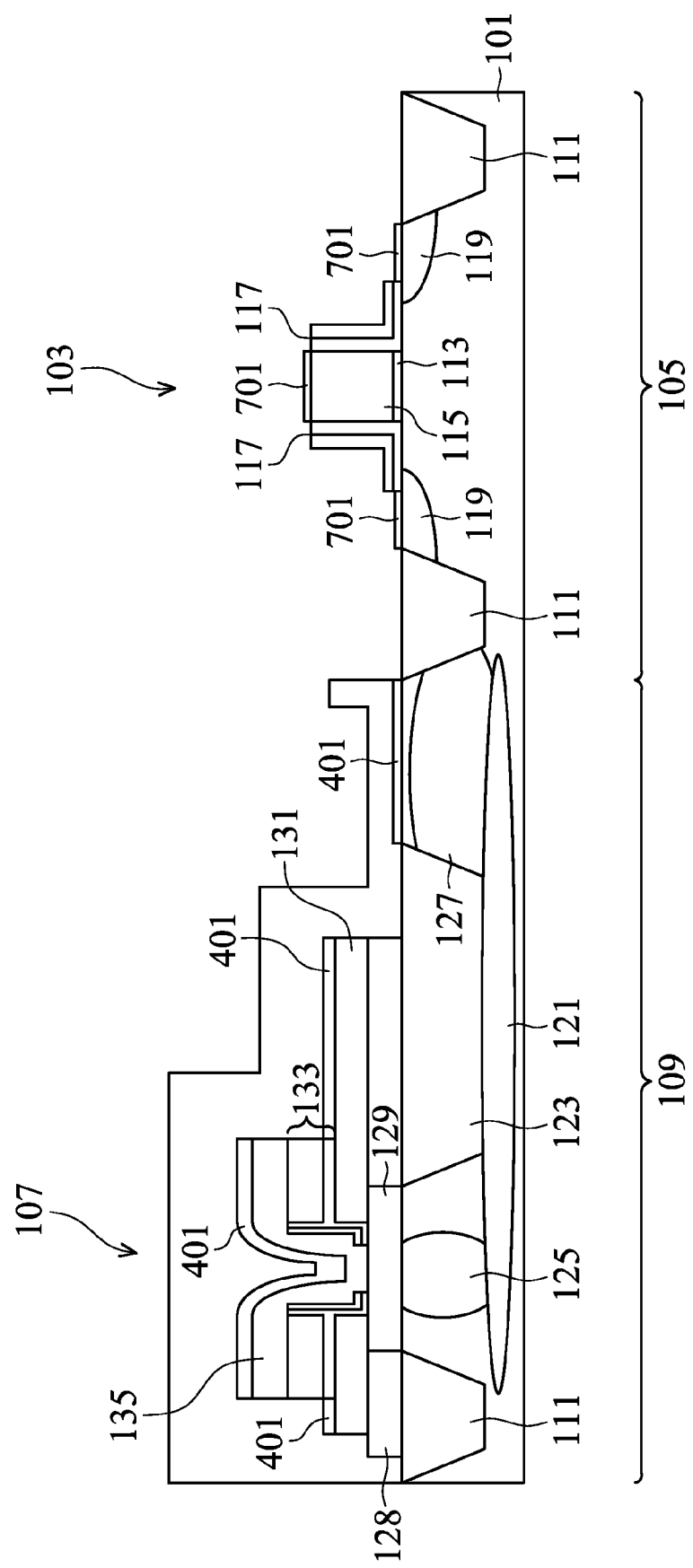
FIG. 7 illustrates the formation of a second silicide in accordance with an embodiment.

FIG. 7 illustrates the removal of the second photoresist 601 and the formation of second silicide contacts 701. After removing the second photoresist 601 through a suitable process such as ashing, the second silicide contacts 701 may be formed on the gate electrode 115 of the first transistor 107 and along the exposed substrate 101 in the first region. However, due to the presence and protection of the second protective layer 501, silicide regions are not newly formed along the second region 109 of the substrate 101.

The second silicide contacts 701 may comprise cobalt, such as, for example, cobalt silicide. However, other commonly used metals, such as titanium, nickel, palladium, platinum, erbium, combinations of these and the like, may also be used. Further, while these materials are similar to the materials utilized for the first silicide contacts 401 (discussed above with respect to FIG. 4), the second silicide contacts 701 may be different materials than the first silicide contacts 401 in order to allow for the optimum materials to be utilized for each of the different devices (e.g., the CMOS first transistor 103 and the bipolar second transistor 107), thereby allowing different sheet resistance requirements to be satisfied for the various different devices. For example, the first silicide contacts 401 may be formed using a cobalt silicide or other types while the second silicide contacts 701 may be formed using a titanium silicide or nickel silicide.

The silicidation to form the second silicide contacts 701 may be performed by blanket deposition of one or more appropriate metal layers, followed by an annealing step, such as a third RTA, in which the metal reacts with the underlying exposed silicon. However, the annealing step to form the second silicide contacts 701 is preferably regulated (through, e.g., the temperature or the timing of the process) such that the second silicide contacts 701 have a smaller thickness than the first silicide contacts 401, or that the first silicide contacts 401 have a larger thickness than the second silicide contacts 701. As such, in an embodiment, the third RTA may be performed at a temperature of between about 950° C. and 1200° C., for about 10 to 30 seconds, such as about 20 seconds. Such conditions allow the second silicide contacts 701, formed from a material such as cobalt silicide, to have a thickness of between about 8 nm and 15 nm, such as about 12 nm, which is smaller than the thickness of the first silicide contacts 401. Once the second silicide contacts 701 have been formed, any un-reacted metal may then be removed, for example, with a selective etch process.

Once the first silicide contacts 401 and second silicide contacts 701 have been formed, another anneal process, such as a fourth RTA, may be performed to change the phase of the first silicide contacts 401 and the second silicide contacts 701 in order to further reduce resistance of the first silicide contacts 401 and second silicide contacts 701. For example, if the first silicide contacts 401 are formed from cobalt silicide, the fourth RTA may be performed to shift the phase of the silicide from CoSi to $CoSi_2$. Similarly, in an embodiment in which the second silicide contacts 701 are the same material as the first silicide contacts 401 (e.g., CoSi), the fourth RTA would similarly shift the phase of the second silicide contacts 701 from CoSi to $CoSi_2$.

Once the first silicide contacts 401 and second silicide contacts 701 have been completed, further processing steps may be taken in order to connect the first silicide contacts 401 and second silicide contacts 701, and also their underlying devices, to contacts from overlying metallization layers (not shown). These steps may include the formation of a inter-layer dielectric layer (ILD) (not shown) and a subsequent formation of contacts (not shown) extending through the ILD to form an electrical connection with each of the first silicide contacts 401 and second silicide contacts 701. The ILD and contacts may be formed using any suitable process known in the art.

By regulating the materials and thicknesses of the first silicide contacts 401 and the second silicide contacts 701 separately from each other, the first silicide contacts 401 and second silicide contacts 701 may be optimized to their respective devices. As such, the old one-size fits all, single-process silicide for every device is no longer necessary, and may be abandoned along with all of its drawbacks. The newly proposed steps of integrated separate silicide regions allow for greater optimization and process control while keeping corresponding costs at a minimum.

Although the embodiments and their advantages have been described in detail, it should be understood that various changes, substitutions and alterations can be made herein without departing from the spirit and scope of the embodiments as defined by the appended claims. For example, the second transistor may be any of a number of differently structured transistors, such as a floating gate transistor or a JFET.

Moreover, the scope of the present application is not intended to be limited to the particular embodiments of the process, machine, manufacture, composition of matter, means, methods and steps described in the specification. As one of ordinary skill in the art will readily appreciate from the disclosure of the present embodiments, processes, machines, manufacture, compositions of matter, means, methods, or steps, presently existing or later to be developed, that perform substantially the same function or achieve substantially the same result as the corresponding embodiments described herein may be utilized according to the present embodiments. Accordingly, the appended claims are intended to include within their scope such processes, machines, manufacture, compositions of matter, means, methods, or steps.

What is claimed is:

1. A method for manufacturing a semiconductor device, the method comprising:
    providing a substrate with a first region and a second region;
    forming a first type of transistor in the first region, the first type of transistor comprising sidewalls along an outer edge of the first type of transistor;
    forming a second type of transistor different from the first type of transistor in the second region;
    forming a first protective layer over the first type of transistor such that the second type of transistor is exposed, the first protective layer extending along the sidewalls of the first type of transistor;
    forming a first silicide on an emitter and a base connection of the second type of transistor, the forming the first silicide on the base connection further comprising forming a continuous silicide on an exposed portion of the base connection and not forming the continuous silicide on a portion of a top surface of the base connection that is not exposed, wherein the top surface of the base connection is on an opposite side of the base connection from the substrate;
    forming a second protective layer over the second type of transistor such that the first type of transistor is exposed; and
    forming a second silicide on the first type of transistor, the second silicide having at least one characteristic that is different than the first silicide.

2. The method of claim 1, wherein the first protective layer is an oxide.

3. The method of claim 1, wherein the at least one characteristic is thickness and the second silicide has a greater thickness than the first silicide.

4. The method of claim 1, wherein the at least one characteristic is material composition.

5. The method of claim 4, wherein the second silicide comprises cobalt and the first silicide comprises titanium or nickel.

6. The method of claim 1, wherein the forming a first protective layer further comprises:
    forming a first protective blanket layer over and in contact with the first type of transistor and the second type of transistor; and
    patterning the first protective blanket layer to expose the second type of transistor and form the first protective layer.

7. The method of claim 6, wherein the forming a first silicide further comprises cleaning the second type of transistor after the patterning the first protective blanket layer such that the the the first type of transistor remains protected by the first protective layer.

8. The method of claim 1, wherein the first type of transistor is a CMOS transistor and the second type of transistor is a bipolar transistor.

9. The method of claim 1, wherein the forming a second protective layer further comprises:
    forming a second protective blanket layer over and in contact with the second type of transistor and the first protective layer;
    patterning the second protective blanket layer to expose the first protective layer and form the second protective layer; and
    removing the first protective layer to expose the first type of transistor.

10. A method of manufacturing a semiconductor device, the method comprising:
    providing a substrate with a first region and a second region;

forming a first transistor in the first region and a second transistor in the second region, wherein the first transistor is a first type of transistor and the second transistor is a second type of transistor;

masking the first transistor with a first protective layer while exposing the second transistor;

forming a first silicide on a source/drain region of the second, transistor after the masking the first transistor, the first silicide comprising a first material;

masking the second transistor with a second protective layer while exposing the first transistor; and forming a second silicide on the first transistor the second silicide comprising a second material different from the first material and having a non-planar top surface; and forming a third silicide on the first transistor at the same time as the forming the second silicide on the first transistor, the third silicide being continuous and being formed on an exposed portion of a first surface of base connection and not on an unexposed portion of the first surface of the base connection, wherein the first surface is opposite a second surface of the base connection, the second surface facing the substrate.

11. The method of claim 10, wherein the second silicide has a thickness that is greater than the thickness of the first silicide.

12. The method of claim 10, wherein the masking the first transistor further comprises:
forming an first protective blanket layer over and in contact with the first transistor and the second transistor;
forming a photoresist over the first protective blanket layer in the first region; and
removing the first protective blanket layer in the second region exposed by the photoresist to form the first protective layer.

13. The method of claim 10, further comprising:
cleaning the second transistor after masking the first transistor; and
monitoring the oxide layer during the cleaning.

14. The method of claim 10, wherein the masking the second transistor further comprises:
forming a second protective blanket layer over and in contact with the second transistor and the first protective layer;
removing the second protective blanket layer over the first protective layer to form the second protective layer; and
removing the first protective layer over the first transistor.

15. The method of claim 10, wherein at least one of the first material and the second material comprises cobalt.

16. A method of manufacturing a semiconductor device, the method comprising:
forming a first transistor in a first region of a substrate and forming a second transistor in a second region of the substrate, the first transistor and the second transistor being different types of transistor and having top surfaces at different distances from the substrate;
forming a first protective layer over the first transistor;
siliciding a portion of the substrate in the second region and a portion of a base collector connection after the forming the first protective layer over the first transistor, wherein the siliciding the portion of the base collector connection does not silicide an unexposed portion of the base collector; connection;
forming a second protective layer over the second transistor;
removing the first protective layer from over the first transistor after the siliciding the portion of the substrate; and
siliciding a first gate and a first source/drain region of the first transistor after the forming the second protective layer over the second transistor.

17. The method of claim 16, wherein the forming the first protective layer over the first transistor further comprises:
forming an first protective blanket layer over and in contact with the first transistor and the second transistor;
forming a photoresist over the first protective blanket layer in the first region; and
removing the first protective blanket layer in the second region exposed by the photoresist to form the first protective layer.

18. The method of claim 17, wherein the forming the second protective layer over the second transistor further comprises:
forming a second protective blanket layer over and in contact with the second transistor and the first protective layer;
removing the second protective blanket layer over the first protective layer to form the second protective layer; and
removing the first protective layer over the first transistor.

19. The method of claim 16, further comprising:
cleaning the second transistor after masking the first transistor; and
monitoring the first protective layer during the cleaning.

20. The method of claim 16, wherein the siliciding the first gate and the first source/drain region further comprising introducing cobalt into the first gate and the first source/drain region.

* * * * *